United States Patent
Ro et al.

(10) Patent No.: US 7,522,449 B2
(45) Date of Patent: Apr. 21, 2009

(54) PHASE CHANGE MEMORY DEVICE AND RELATED PROGRAMMING METHOD

(75) Inventors: Yu-Hwan Ro, Seocho-gu (KR);
Kwang-Jin Lee, Hwaseong-si (KR);
Sang-Beom Kang, Hwaseong-si (KR);
Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 11/790,011

(22) Filed: Apr. 23, 2007

(65) Prior Publication Data
US 2008/0074918 A1    Mar. 27, 2008

(30) Foreign Application Priority Data
Sep. 27, 2006    (KR) .................... 10-2006-0094155

(51) Int. Cl.
*G11C 11/00* (2006.01)

(52) U.S. Cl. ...................................... 365/163; 365/148

(58) Field of Classification Search ................ 365/163, 365/148, 113
See application file for complete search history.

(56) References Cited

U.S. PATENT DOCUMENTS

| | | | |
|---|---|---|---|
| 5,784,317 A | 7/1998 | Ha | |
| 6,751,114 B2 | 6/2004 | Gilton et al. | |
| 6,972,993 B2 | 12/2005 | Conley et al. | |
| 7,050,328 B2* | 5/2006 | Khouri et al. | 365/163 |
| 7,259,982 B2* | 8/2007 | Johnson | 365/163 |
| 2005/0068804 A1 | 3/2005 | Choi et al. | |
| 2005/0248993 A1 | 11/2005 | Lee et al. | |
| 2006/0158948 A1* | 7/2006 | Fui | 365/222 |
| 2008/0055963 A1* | 3/2008 | Lee et al. | 365/148 |

* cited by examiner

*Primary Examiner*—Anh Phung
(74) *Attorney, Agent, or Firm*—Volentine & Whitt, PLLC

(57) ABSTRACT

In various methods of performing program operations in phase change memory devices, selected memory cells are repeatedly programmed to obtain resistance distributions having desired characteristics such as adequate sensing margins.

20 Claims, 13 Drawing Sheets

FIG. 12

| IO<br>Verify Cycle | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Cycle | 0 | 0 | 0 | 0 | 0 | 0 | 0 | 0 | 0 | 0 | 0 | 0 | 1 | 0 | 0 | 0 |
| 2nd Cycle | 1 | 0 | 0 | 0 | 0 | 0 | 0 | 0 | 0 | 0 | 0 | 0 | 1 | 0 | 0 | 0 |
| 3rd Cycle | 1 | 0 | 0 | 0 | 0 | 0 | 0 | 1 | 0 | 0 | 0 | 0 | 1 | 0 | 1 | 0 |
| 4th Cycle | 1 | 0 | 0 | 0 | 0 | 0 | 1 | 1 | 0 | 1 | 0 | 0 | 1 | 0 | 1 | 1 |
| 5th Cycle | 1 | 0 | 1 | 1 | 1 | 0 | 1 | 1 | 1 | 1 | 1 | 0 | 1 | 1 | 1 | 1 |
| 6th Cycle | 1 | 0 | 0 | 1 | 1 | 1 | 1 | 1 | 1 | 1 | 1 | 0 | 1 | 1 | 1 | 1 |
| 7th Cycle | 1 | 1 | 1 | 1 | 1 | 1 | 1 | 1 | 1 | 1 | 1 | 1 | 1 | 1 | 1 | 1 |
| 8th Cycle | 1 | 1 | 1 | 1 | 1 | 1 | 1 | 1 | 1 | 1 | 1 | 1 | 1 | 1 | 1 | 1 |
| 9th Cycle |  |  |  |  |  |  |  |  |  |  |  |  |  |  |  |  |
| 10th Cycle |  |  |  |  |  |  |  |  |  |  |  |  |  |  |  |  |
| 11th Cycle |  |  |  |  |  |  |  |  |  |  |  |  |  |  |  |  |

PHASE CHANGE MEMORY DEVICE AND RELATED PROGRAMMING METHOD

BACKGROUND OF THE INVENTION

1. Field of the Invention

Embodiments of the invention relate generally to semiconductor memory devices. More particularly, embodiments of the invention relate to phase change devices and related programming methods.

A claim of priority is made to Korean Patent Application No. 10-2006-0094155 filed on Sep. 27, 2006, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

Phase change memory devices typically use the amorphous state to represent a logical "1" and the crystalline state to represent a logical "0". The crystalline state is generally referred to as a "set state", and the amorphous state is referred to as a "reset state". Accordingly, phase change memory cells in the phase change memory devices typically store a logical "0" by "setting" a phase change material in the memory cells to the crystalline state, and the phase change memory cells stores a logical "1" by "resetting" the phase change material to the amorphous state. Various phase change memory devices are disclosed, for example, U.S. Pat. Nos. 6,487,113 and 6,480,438.

The phase change material in a phase change memory device is typically converted to the amorphous state by heating the material to above a predetermined melting temperature and then quickly cooling the material. The phase change material is typically converted to the crystalline state by heating the material at another predetermined temperature below the melting temperature for a period of time. Accordingly, data is written to memory cells in a phase change memory device by converting the phase change material in memory cells of the phase change memory device between the amorphous and crystalline states using heating and cooling as described.

The phase change material in a phase change memory device typically comprises a compound including germanium (Ge), antimony (Sb), and tellurium (Te), i.e., a "GST" compound. The GST compound is well suited for a phase change memory device because it can quickly transition between the amorphous and crystalline states by heating and cooling.

At least one type of phase change memory cell comprises a top electrode, a chalcogenide layer, a bottom electrode contact, a bottom electrode, and an access transistor or a diode, wherein the chalcogenide layer is the phase change material of the phase change memory cell. Accordingly, a read operation is performed on the phase change memory cell by measuring the resistance of the chalcogenide layer, and a program operation is performed on the phase change memory cell by heating and cooling the chalcogenide layer as described above. A phase change memory cell typically further comprises a switching element used to control a supply of current to the phase change material for program operations.

In general, the resistance of the phase change material in different phase change memory cells tends to vary due to minor differences in process conditions, programming and reading conditions, and a variety of other factors. As a result, the "set state" and the "reset state" for phase change memory cells are typically characterized by resistance distributions such as the bell shaped curves illustrated in figure (FIG.) 1. In other words, phase change memory cells in the "set state" or the "reset state" can exhibit a wide range of different resistance values.

FIG. 1 is a graph illustrating resistance distributions for phase change memory cells in the "set state" and the "reset state", respectively. In FIG. 1, resistance "R" of the GST compound in the phase change memory cells is measured along the x-axis, and a number of phase change memory cells in a phase change memory device having each particular resistance value is measured along the y-axis.

In FIG. 1, a first distribution labeled "S1" represents phase change memory cells in the "set state" and a second distribution labeled "R1" represents phase change memory cells in the "reset state". A sensing margin "SM" exists in FIG. 1 between a maximum value of the first distribution and a minimum value of the second distribution. Also in FIG. 1, a distance between a pair of relatively longer dotted lines represents a desired sensing margin between the first and second distributions.

Because the sensing margin in FIG. 1 is significantly smaller than the desired sensing margin, there is an undesirably high likelihood that phase change memory cells having the distributions illustrated in FIG. 1 will experience read or program errors due to minor variations in read and programming conditions. For example, due to the relatively small sensing margin illustrated in FIG. 1, minor variations in a reference read resistance or slight perturbations in measured resistance values of selected memory cells can result in erroneous readings of the states of the selected memory cells.

SUMMARY OF THE INVENTION

According to one embodiment of the present invention, a method of performing a program operation in a phase change memory device comprising a plurality of phase change memory cells is provided. The method comprises (a) selecting multiple memory cells among the plurality of phase change memory cells; (b) programming a bit of program data to each of the selected memory cells, wherein each bit of program data comprises a bit of set data or a bit of reset data; (c) performing a verification read operation on the selected memory cells, the verification read operation comprising comparing a bit of read data stored in each of the selected memory cells with a corresponding bit among the program data; (d) identifying any failed cells among the selected memory cells by determining whether each bit of read data stored in the selected memory cells is the same as the corresponding bit among the program data; (e) upon identifying at least one failed cell among the selected memory cells, determining whether a corresponding bit of program data for any of the failed cells comprises a bit of set data, and determining whether a corresponding bit of program data for any of the failed cells comprises a bit of reset data; (f) upon determining that a corresponding bit of program data for any of the failed cells comprises a bit of set data, re-programming all of the selected memory for which the corresponding bit of program data comprises a bit of set data; and (g) upon determining that a corresponding bit of program data for any of the failed cells comprises a bit of reset data, re-programming each of the failed cells for which the corresponding bit of program data comprises a bit of reset data, and not re-programming selected memory cells that have been successfully programmed with a bit of reset data.

According to another embodiment of the invention, a method of performing a program operation in a phase change memory device comprising a plurality of phase change memory cells is provided. The method comprises (a) selecting multiple memory cells among the plurality of phase change memory cells; (b) programming a bit of program data to each of the selected memory cells, wherein each bit of program data comprises a bit of set data or a bit of reset data; (c) performing a verification read operation on the selected memory cells, the verification read operation comprising comparing a bit of read data stored in each of the selected memory cells with a corresponding bit among the program data; (d) identifying any failed cells among the selected memory cells by determining whether each bit of read data stored in the selected memory cells is the same as the corresponding bit among the program data; and (e) upon identifying at least one failed cell among the selected memory cells, re-programming all of the selected memory cells.

According to still another embodiment of the invention, a method of performing a program operation in a phase change memory device comprising a plurality of phase change memory cells is provided. The method comprises (a) selecting multiple memory cells among the plurality of phase change memory cells; (b) programming a bit of program data to each of the selected memory cells, wherein each bit of program data comprises a bit of set data or a bit of reset data; (c) performing a verification read operation on the selected memory cells, the verification read operation comprising comparing a bit of read data stored in each of the selected memory cells with a corresponding bit among the program data; (d) identifying any failed cells among the selected memory cells by determining whether each bit of read data stored in the selected memory cells is the same as the corresponding bit among the program data; and (e) upon identifying at least one failed cell among the selected memory cells, re-programming all failed cells among the selected memory cells.

BRIEF DESCRIPTION OF THE DRAWINGS

Embodiments of the invention are described below in relation to the accompanying drawings. Throughout the drawings like reference numbers indicate like exemplary elements, components, and steps. In the drawings:

FIG. 12 is a chart illustrating an example of a program operation performed using the method of FIG. 11;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 2:
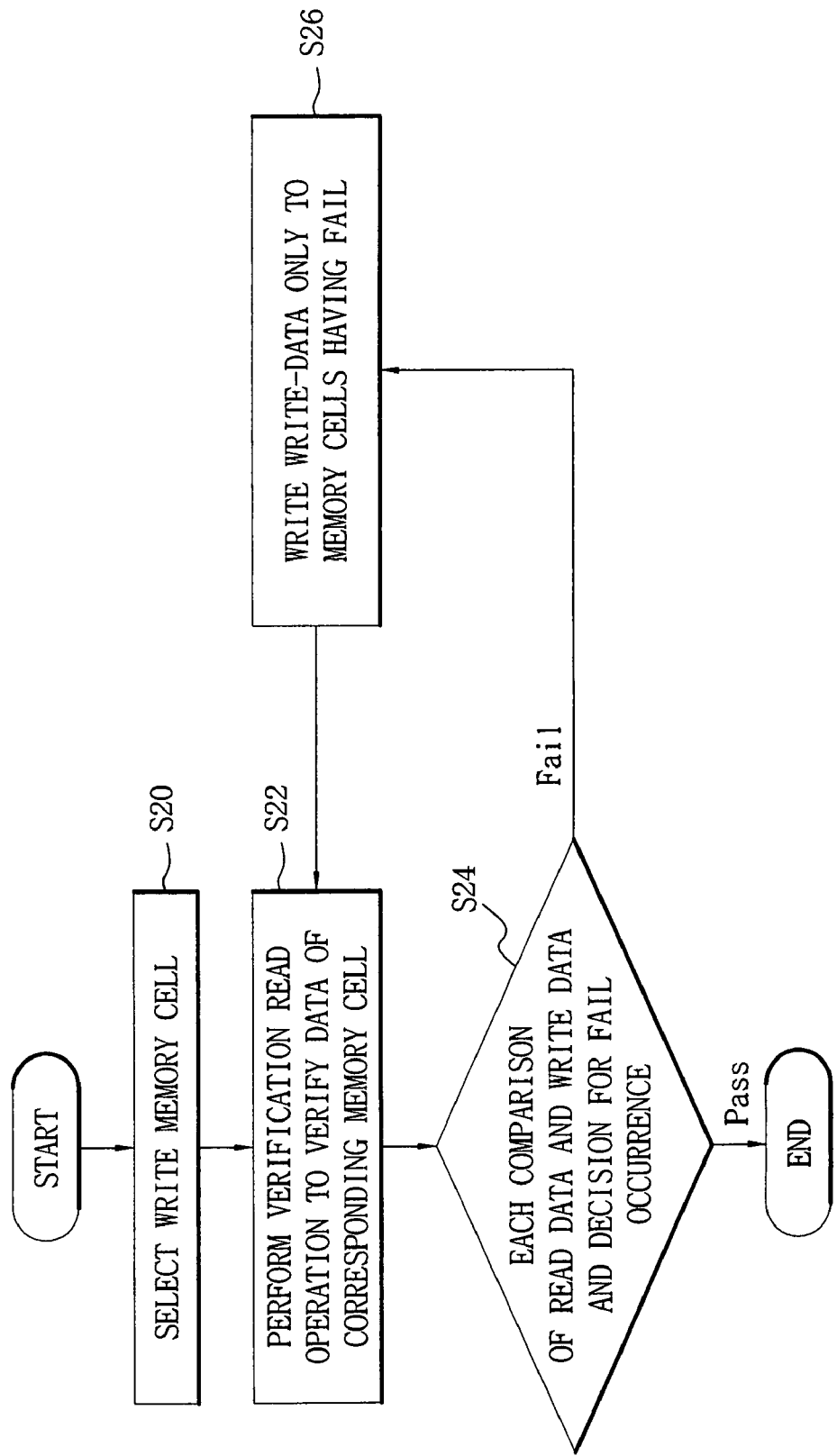
FIG. 2 is a flowchart illustrating a method of performing a program operation in a phase change memory device according to one embodiment of the invention.

FIG. 2 is a flowchart illustrating a method of performing a program operation (also called a "write operation", e.g., in the drawings) in a phase change memory device according to one embodiment of the invention. In the example of FIG. 2, and also in other examples, it will be assumed that the phase change memory device comprises a plurality of phase change memory cells, wherein each phase change memory cell uses the GST compound as the phase change material. In this written description, exemplary method steps will be denoted by parentheses (SXX).

Referring to FIG. 2, the method first selects a plurality of phase change memory cells in the phase change memory device (S20). The selected memory cells may be referred to as "write memory cells" or "program memory cells" because the selected memory cells are programmed in the program operation of FIG. 2.

After step S20, the method performs a verification read operation to detect whether each of the selected memory cells has a desired logic state (S22). Typically, the verification read operation reads data stored in the selected memory cells ("read data") and compares each bit of the read data with a corresponding bit of data to be programmed in the selected memory cells ("write data" or "program data").

Based on the comparisons performed in the verification read operation, the method determines whether the read data for any of the selected memory cells is different from corresponding program data (S24). Where one or more comparisons between read data and program data in the verification read operation indicates that the read data for a particular one of the selected memory cells is different from the program data for the particular one of the selected memory cells, the method generates a "program fail" indication. Otherwise, the method generates a "program pass" indication. Memory cells for which read data is detected to be different from corresponding program data will be referred to as "failed cells".

Where the method generates the "program pass" indication (S24="Pass"), the method terminates. Otherwise, where the method generates the "program fail" indication (S24="Fail"), the method continues by programming corresponding program data into the failed cells (S26). Steps S22 and S24 are repeated on the failed cells each time step S26 is performed, and step S26 is repeated each time the method generates the "program fail" indication.

For explanation purposes, it will be assumed throughout this written description that selected memory cells having the "set state" (i.e., storing logic state "0") tend to exhibit resistances between 10 and 20 k$\Omega$, and selected memory cells having the "reset state" (i.e., storing logic state "1") tend to exhibit resistances between 40 and 50 k$\Omega$). Under these assumptions, a resistance value of 30 k$\Omega$ can be used as a reference resistance value to detect logic states of the selected memory cells in general read operations, and resistance values around 20 k$\Omega$ and 40 k$\Omega$ can be used as reference verification resistance values for detecting whether the selected memory cells have been properly programmed into the set and reset states, respectively.

As an example of the method illustrated in FIG. 2, suppose that 16 bits of data are to be programmed in 16 memory cells of the phase change memory device. The 16 bits of data may be provided to the phase change memory device, for example, via a plurality of input/output (IO) lines. The 16 memory cells are then selected (S20). Between steps S20 and S22, the 16 memory cells may be programmed with the respective 16 bits, although a programming step is not explicitly illustrated in FIG. 2. Similarly, in other embodiments of the invention, a programming step may be performed between a step for selecting memory cells and a step for performing a verification read operation on the selected memory cells.

Next, suppose that each of the 16 memory cells was successfully programmed, except for a single memory cell. The verification read operation method compares read data corresponding to each of the 16 memory cells with the 16 bits received via the plurality of IO lines (S22). Next, the method generates the "program fail" indication due to the one memory cell that was not successfully programmed (S24). Then, the one memory cell that was not successfully programmed is re-programmed (S26). Finally, assuming that the re-program operation is successful, steps S22 and S24 are repeated, the method generates the "program pass" indication, and then the method terminates.

Figure 3:
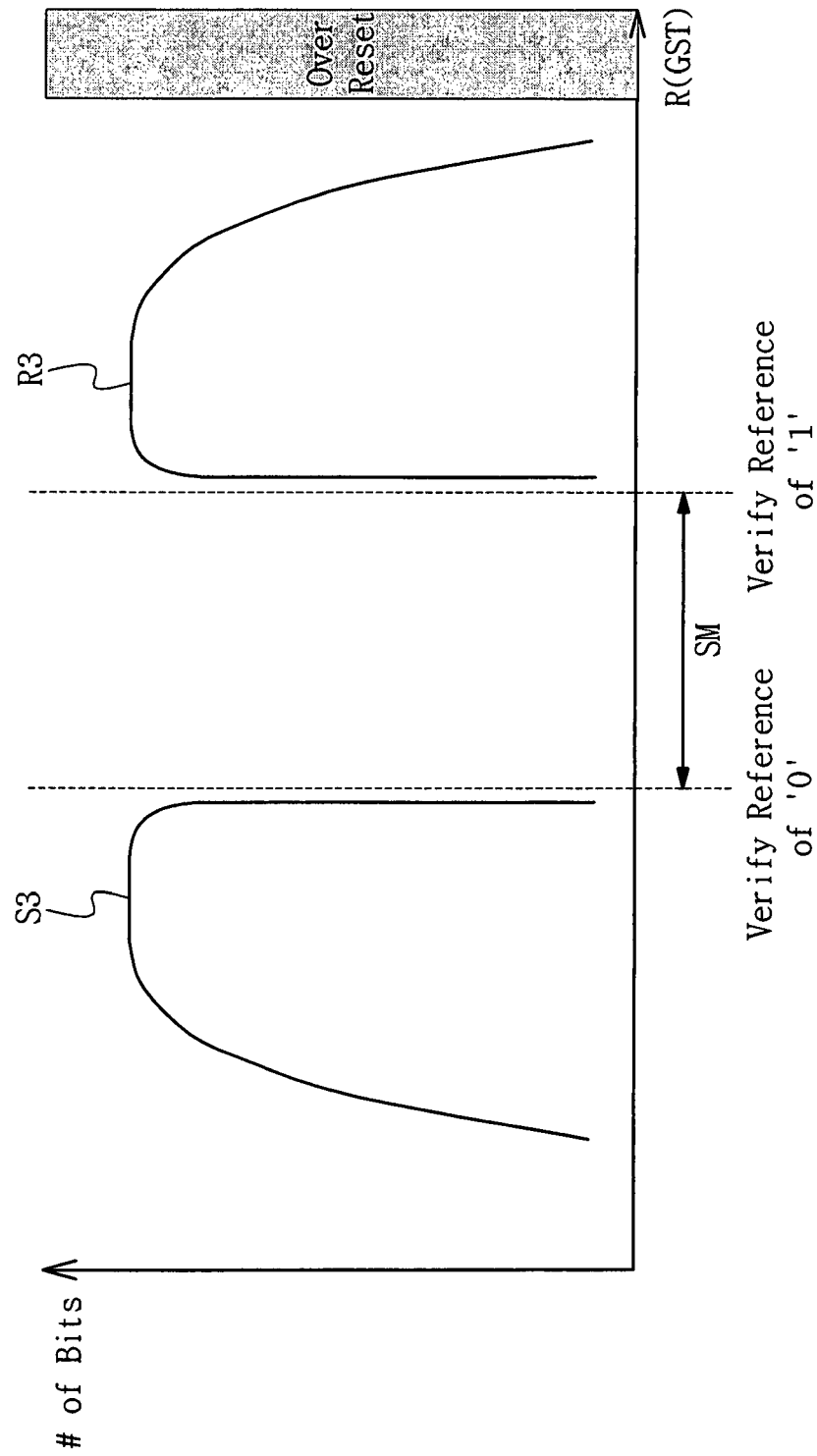
FIG. 3 is a graph illustrating resistance distributions for phase change memory cells in the "set state" and the "reset state" after the phase change memory cells have been programmed using the method illustrated in FIG. 2.

FIG. 3 is a graph illustrating resistance distributions for phase change memory cells in the "set state" and the "reset state" after the phase change memory cells have been programmed using the method illustrated in FIG. 2. In FIG. 3, resistance "R" of the GST compound in the phase change memory cells is measured along the x-axis, and a number of phase change memory cells in a phase change memory device having each particular resistance value is measured along the y-axis.

In FIG. 3, a first distribution labeled "S3" represents phase change memory cells in the "set state" and a second distribution labeled "R3" represents phase change memory cells in the "reset state". A sensing margin "SM" exists in FIG. 3 between a maximum value of the first distribution and a minimum value of the second distribution. The sensing margin "SM" of FIG. 3 is relatively large compared with the sensing margin "SM" of FIG. 1.

In FIG. 3, dotted lines represent verify resistance levels used to determine the respective logic states of data stored in the phase change memory cells of the phase change memory device. In particular, a dotted line labeled "verify reference of '0'" denotes a first verify resistance level used to determine whether a phase change memory cell stores a logical "0". Similarly, a dotted line labeled "verify reference of '1'" denotes a second verify resistance level used to determine whether a phase change memory cell stores a logical "1".

Where the phase change material in a particular phase change memory cell of the phase change memory device has a resistance less than the first verify resistance level, the particular phase change memory cell stores a logical "0". On the other hand, where the phase change material in the particular phase change memory cell of the phase change memory device has a resistance greater than the second verify resistance level, the particular phase change memory cell stores a logical "1". Finally, where the phase change material in the particular phase change memory cell of the phase change memory device has a resistance between the first and second verify resistance levels, the particular phase change memory cell does not store any data.

As shown in FIG. 3, a relatively large number of memory cells have resistances close to the first and second verify resistance levels after the method of FIG. 2 is performed. One reason for this is that many phase change memory cells may have individual resistance distributions (over repeated program operations) overlapping the region between the first and second verify voltage levels. As a result, where repeated programming steps are taken (i.e., via step S26), a significant number of the many memory cells having distributions overlapping the region between the first and second verify voltage levels may end up with resistances close to the first and second verify resistance levels.

Figure 1:
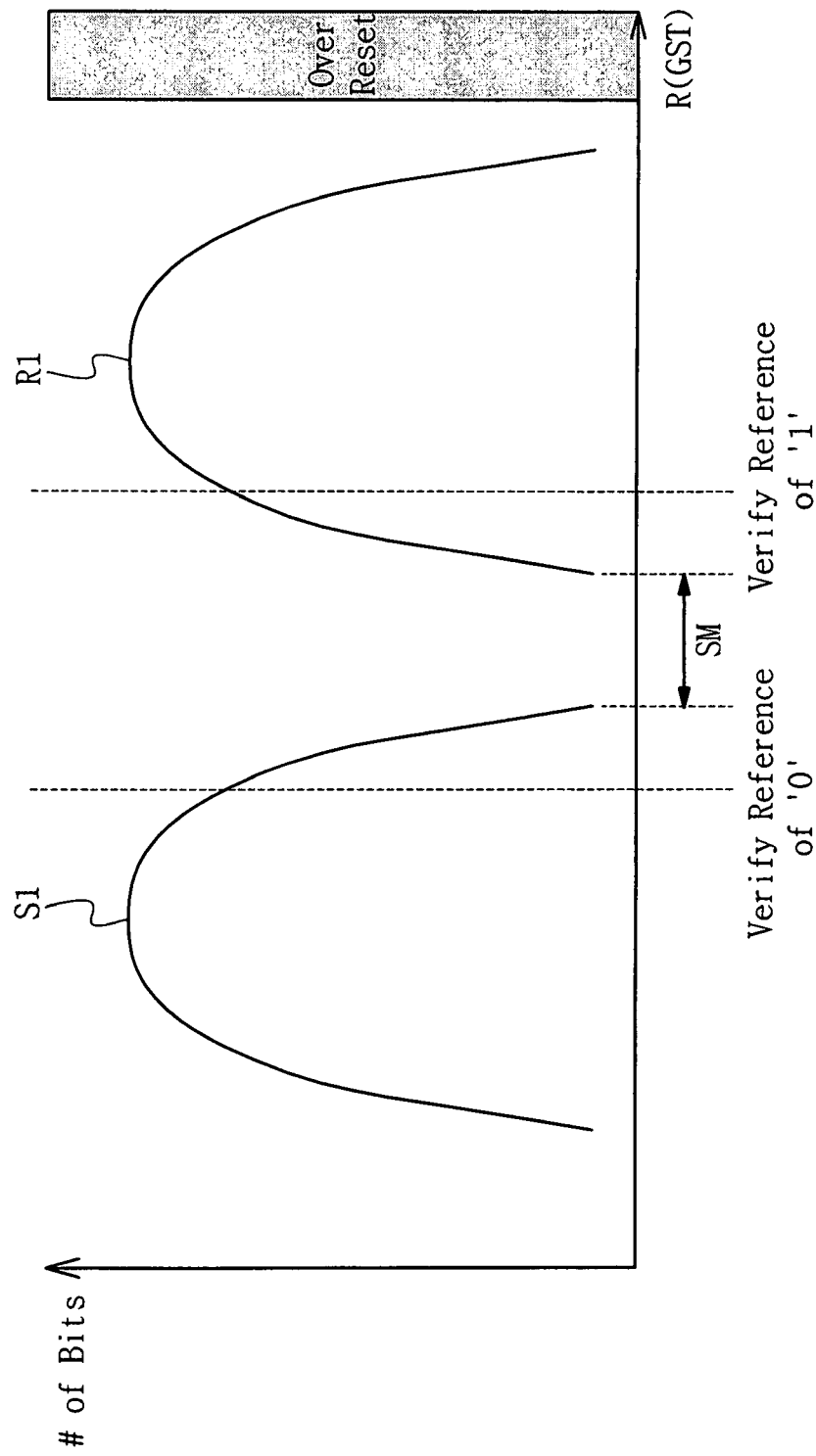
FIG. 1 is a graph illustrating resistance distributions for phase change memory cells in the "set state" and the "reset state", respectively.

Although the resistance distributions illustrated in FIG. 3 have a larger sensing margin than the resistance distributions illustrated in FIG. 1, it may still be undesirable to have the relatively large number of memory cells with resistances close to the first and second verify resistance levels. For example, where a large number of memory cells have resistances very close to the first and second verify resistance levels, minor variations in a reference read resistance used to perform read operations can lead to a significant number of read errors.

Figure 4:
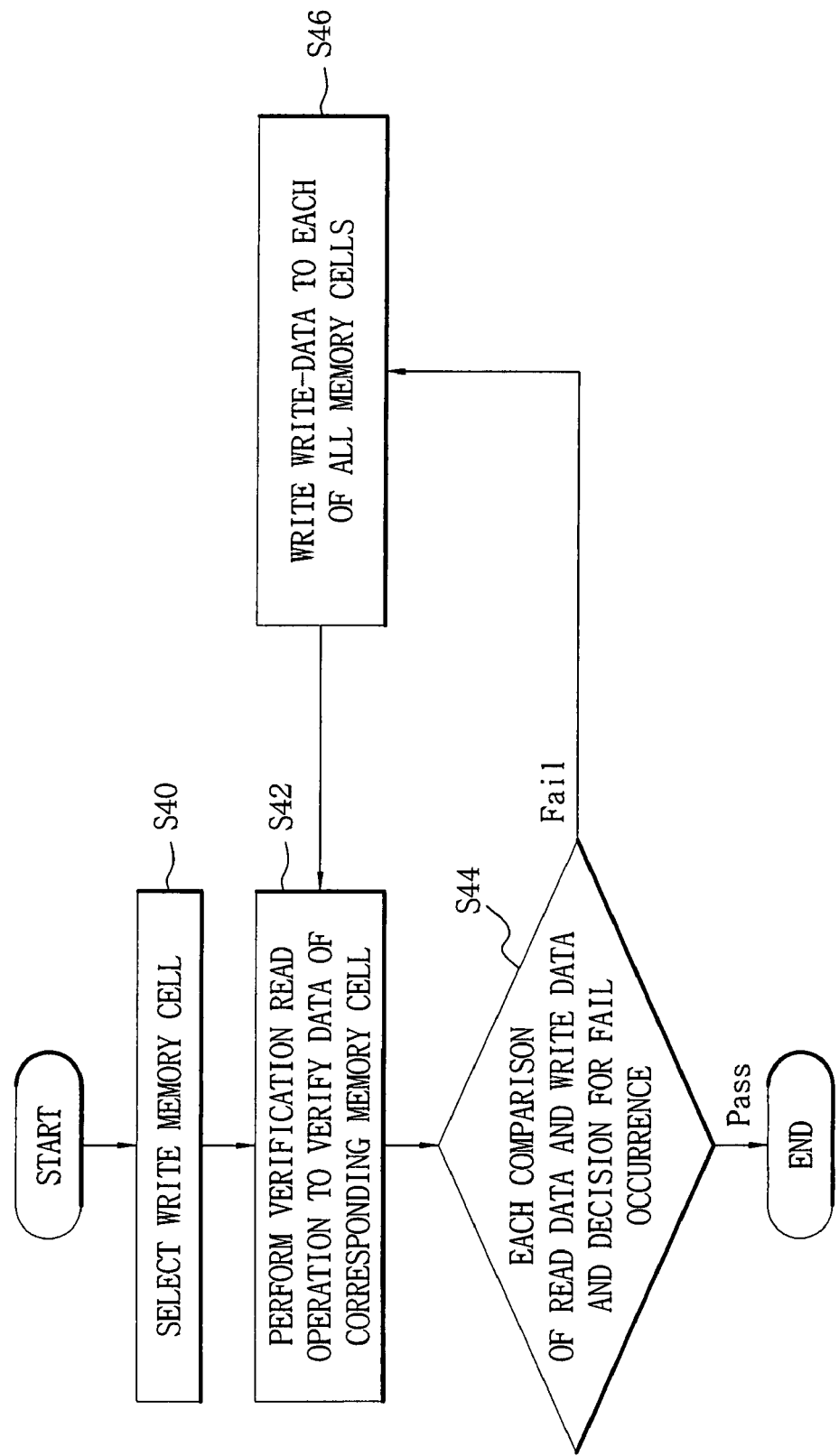
FIG. 4 is a flowchart illustrating a method of performing a program operation in a phase change memory device according to another embodiment of the invention.

FIG. 4 is a flowchart illustrating a method of performing a program operation in a phase change memory device according to another embodiment of the invention.

Referring to FIG. 4, the method first selects a plurality of phase change memory cells in the phase change memory device (S40). After step S40, the method performs a verification read operation to detect whether each of the selected memory cells has a desired logic state (S42). Based on the comparisons performed in the verification read operation, the method determines whether the read data for any of the selected memory cells is different from corresponding program data (S44). Where one or more comparisons between read data and program data in the verification read operation indicates that the read data for a particular one of the selected memory cells is different from the program data for the particular one of the selected memory cells, the method generates a program fail indication. Otherwise, the method generates a program pass indication.

Where the method generates the "program pass" indication (S44="Pass"), the method terminates. Otherwise, where the method generates the "program fail" indication (S44="Fail"), all of the selected memory cells are re-programmed (S46). Steps S42 and S44 are repeated each time step S46 is performed, and step S46 is repeated each time the method generates the "program fail" indication.

Figure 5:
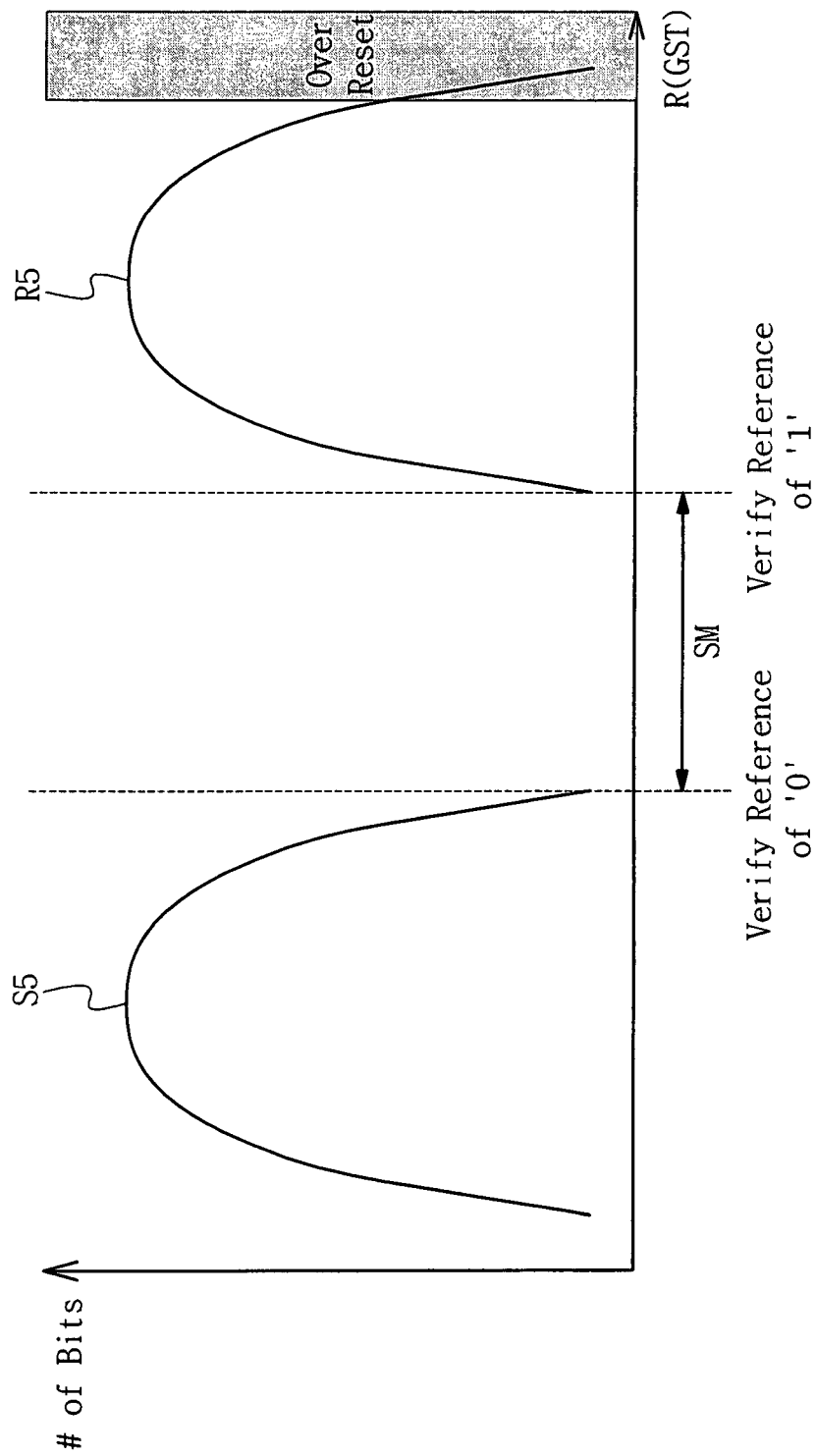
FIG. 5 is a graph illustrating resistance distributions for phase change memory cells in the "set state" and the "reset state" after the phase change memory cells have been programmed using the method illustrated in FIG. 4.

FIG. 5 is a graph illustrating resistance distributions for phase change memory cells in the "set state" and the "reset state" after the phase change memory cells have been programmed using the method illustrated in FIG. 4. In FIG. 5, resistance "R" of the GST compound in the phase change memory cells is measured along the x-axis, and a number of phase change memory cells in a phase change memory device having each particular resistance value is measured along the y-axis.

In FIG. 5, a first distribution labeled "S5" represents phase change memory cells in the "set state" and a second distribution labeled "R5" represents phase change memory cells in the "reset state". A sensing margin "SM" exists in FIG. 5 between a maximum value of the first distribution and a minimum value of the second distribution. The sensing margin "SM" of FIG. 5 is similar to the sensing margin "SM" of FIG. 3 and relatively large compared with the sensing margin "SM" of FIG. 1.

In FIG. 5, dotted lines represent verify reference voltage levels used to determine the respective logic states of data stored in the phase change memory cells of the phase change memory device. In particular, a dotted line labeled "verify reference of '0'" denotes a first verify resistance level used to determine whether a phase change memory cell stores a logical "0". Similarly, a dotted line labeled "verify reference of '1'" denotes a second verify resistance level used to determine whether a phase change memory cell stores a logical "1".

Where the phase change material in a particular phase change memory cell of the phase change memory device has a resistance less than the first verify resistance level, the particular phase change memory cell stores a logical "0". On the other hand, where the phase change material in the particular phase change memory cell of the phase change memory device has a resistance greater than the second verify resistance level, the particular phase change memory cell stores a logical "1". Finally, where the phase change material in the particular phase change memory cell of the phase change memory device has a resistance between the first and second verify resistance levels, the particular phase change memory cell does not store any data.

Unlike the first and second distributions in FIG. 3, the first and second distributions in FIG. 5 do not show a relatively large number of memory cells with resistances very close to the first and second verify resistance levels. However, a part of the second distribution in FIG. 5 overlaps with an "over reset" region, meaning that some memory cells programmed using the method of FIG. 4 have undesirably large resistance values. The phase change memory cells having these undesirably large resistance values may remain in the reset state even when further programming is performed to change their logic state. In other words, phase change memory cells in the over reset region may lose their ability to be re-programmed, remaining in the amorphous state.

Figure 6:
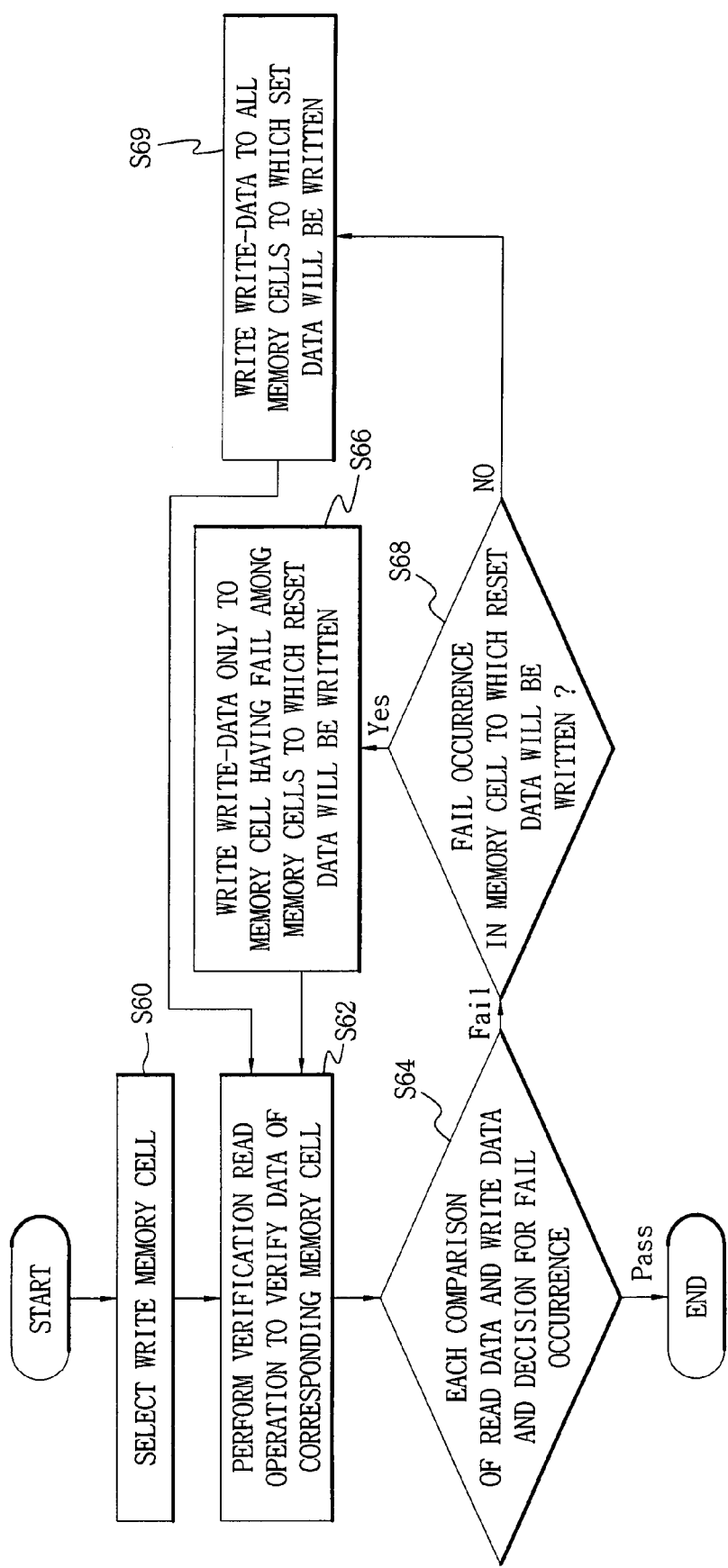
FIG. 6 is a flowchart illustrating a method of performing a program operation in a phase change memory device according to still another embodiment of the invention.

FIG. 6 is a flowchart illustrating a method of performing a program operation in a phase change memory device according to still another embodiment of the invention. The method of FIG. 6 is similar to the method of FIG. 4, except that in the method of FIG. 6, selected cells to be programmed to the reset state are only re-programmed if detected to be failed cells.

Referring to FIG. 6, the method first selects a plurality of phase change memory cells in the phase change memory device (S60). After step S60, the method performs a verification read operation to detect whether each of the selected memory cells has a desired logic state (S62). Based on the comparisons performed in the verification read operation, the method determines whether the read data for any of the selected memory cells is different from corresponding program data (S64). Where one or more comparisons between read data and program data in the verification read operation indicates that the read data for a particular one of the selected memory cells is different from the program data for the particular one of the selected memory cells, the method generates a program fail indication. Otherwise, the method generates a program pass indication.

Where the method generates the "program pass" indication (S64="Pass"), the method terminates. Otherwise, where the method generates the "program fail" indication (S64="Fail"), the method then determines whether each selected memory cell is to be programmed to the "reset state" or the "set state" (S68). After step S68, each selected memory cell to be programmed to the "set state" is re-programmed (S69). However, among the selected memory cells to be programmed to the "reset state", only failed cells are re-programmed (S66).

Steps S62 and S64 are repeated each time either of steps S66 and 69 are performed, and at least one of steps S66 and S69 is repeated each time the method of FIG. 6 generates the "program fail" indication.

Figure 7:
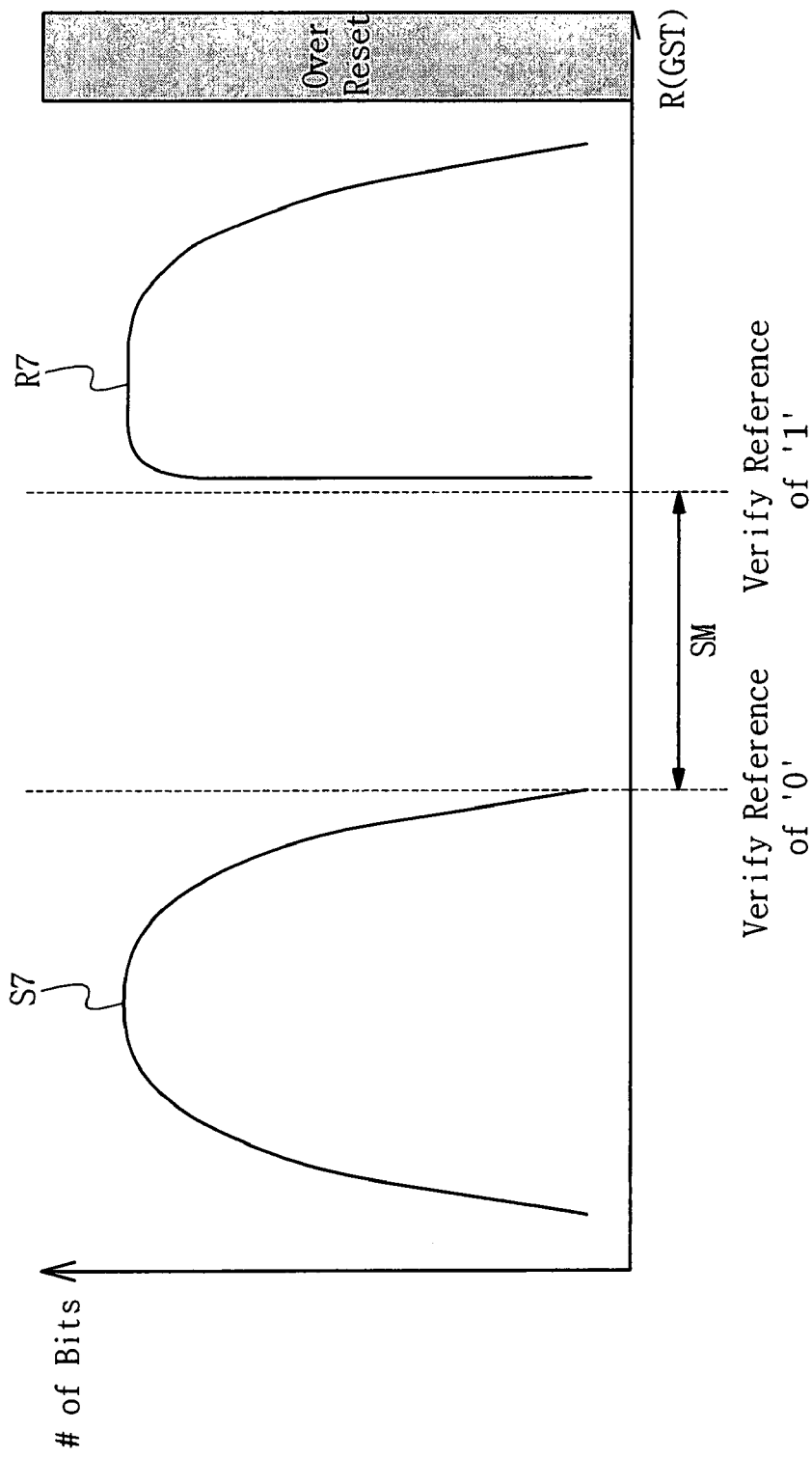
FIG. 7 is a graph illustrating resistance distributions for phase change memory cells in the "set state" and the "reset state" after the phase change memory cells have been programmed using the method illustrated in FIG. 6.

Because the method of FIG. 6 does not re-program non-failed cells to be programmed to the reset state, the problem of selected memory cells with resistance values in the "over reset" region is avoided, as illustrated in FIG. 7.

FIG. 7 is a graph illustrating resistance distributions for phase change memory cells in the "set state" and the "reset state" after the phase change memory cells have been programmed using the method illustrated in FIG. 6. In FIG. 7, resistance "R" of the GST compound in the phase change memory cells is measured along the x-axis, and a number of phase change memory cells in a phase change memory device having each particular resistance value is measured along the y-axis.

In FIG. 7, a first distribution labeled "S7" represents phase change memory cells in the "set state" and a second distribution labeled "R7" represents phase change memory cells in the "reset state". A sensing margin "SM" exists in FIG. 7 between a maximum value of the first distribution and a minimum value of the second distribution. The sensing margin "SM" of FIG. 7 is similar to the sensing margin "SM" of FIGS. 3 and 5 and relatively large compared with the sensing margin "SM" of FIG. 1.

In FIG. 7, dotted lines represent verify resistance levels used to determine the respective logic states of data stored in the phase change memory cells of the phase change memory device. In particular, a dotted line labeled "verify reference of '0'" denotes a first verify resistance level used to determine whether a phase change memory cell stores a logical "0". Similarly, a dotted line labeled "verify reference of '1'" denotes a second verify resistance level used to determine whether a phase change memory cell stores a logical "1".

Where the phase change material in a particular phase change memory cell of the phase change memory device has a resistance less than the first verify resistance level, the particular phase change memory cell stores a logical "0". On the other hand, where the phase change material in the particular phase change memory cell of the phase change memory device has a resistance greater than the second verify resistance level, the particular phase change memory cell stores a logical "1". Finally, where the phase change material in the particular phase change memory cell of the phase change memory device has a resistance between the first and second verify resistance levels, the particular phase change memory cell does not store any data.

Like the first distribution of FIG. 5, the first distribution of FIG. 7 does not include a relatively large number of memory cells with resistances relatively close to the first verify resistance level. However, the second distribution of FIG. 7 does include a relatively large number of memory cells with resistances close to the second verify resistance level, which may cause a relatively large number of read errors.

Figure 8:
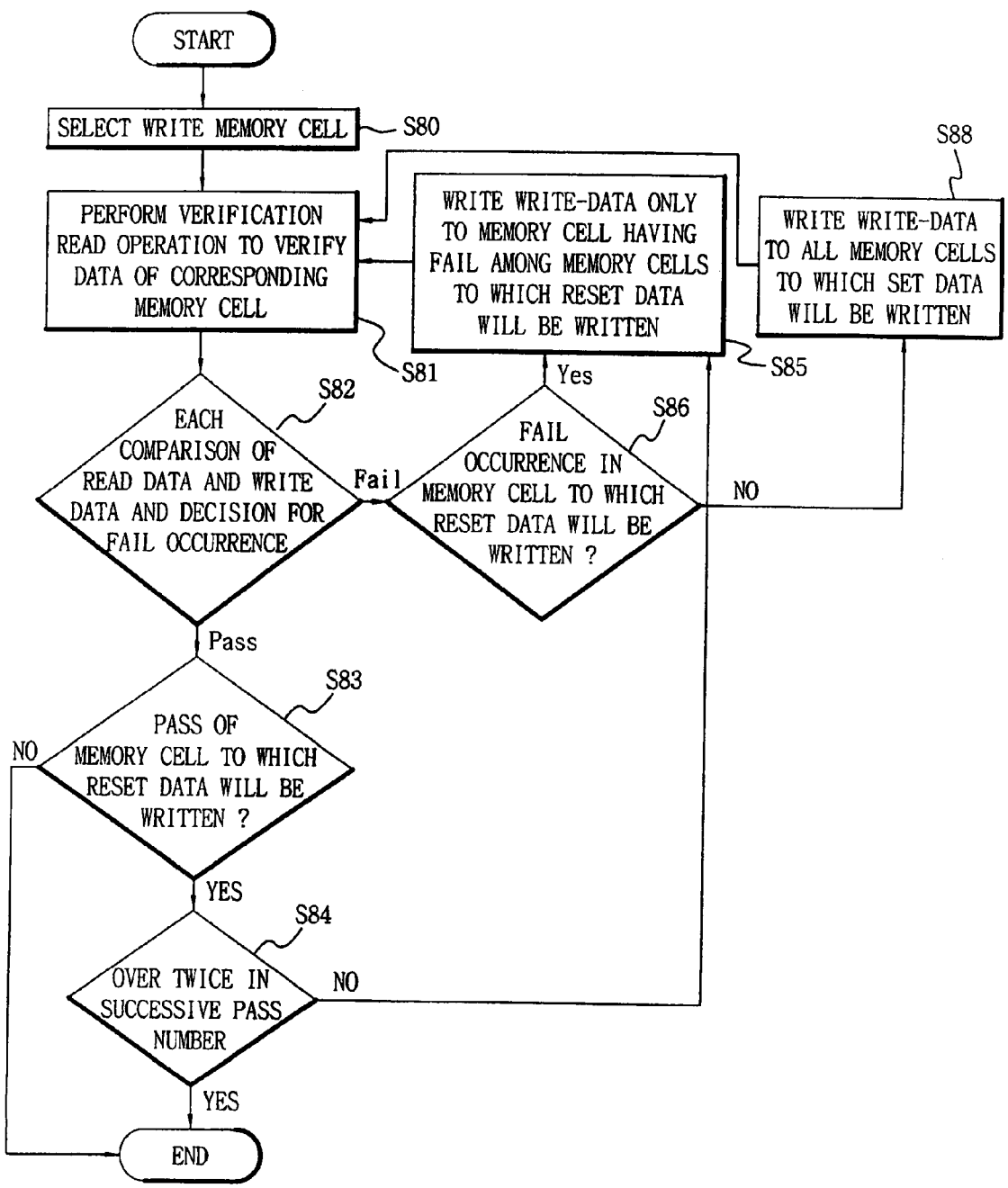
FIG. 8 is a flowchart illustrating a method of performing a program operation in a phase change memory device according to still another embodiment of the invention.

FIG. 8 is a flowchart illustrating a method of performing a program operation in a phase change memory device according to still another embodiment of the invention.

Referring to FIG. 8, the method first selects a plurality of phase change memory cells in the phase change memory device (S80). The selected memory cells may be referred to as "write memory cells" or "program memory cells" because the selected memory cells are programmed in the program operation of FIG. 8.

After step S80, the method performs a verification read operation to detect whether each of the selected memory cells has a desired logic state (S81). Typically, the verification read operation reads data stored in the selected memory cells ("read data") and compares each bit of the read data with a corresponding bit of data to be programmed in the selected memory cells ("write data" or "program data").

Based on the comparisons performed in the verification read operation, the method determines whether the read data for any of the selected memory cells is different from corresponding program data (S82). Where one or more comparisons between read data and program data in the verification read operation indicates that the read data for a particular one of the selected memory cells is different from the program data for the particular one of the selected memory cells, the method generates a program fail indication. Otherwise, the method generates a program pass indication.

Where the method generates the "program pass" indication (S82="Pass"), the method then determines whether any of the selected memory cells were programmed to the reset state (S83). Where none of the selected memory cells were programmed to the reset state (S83="NO"), the method terminates. Otherwise (S83="YES"), where at least one of the selected memory cells was programmed to the reset state, the method determines whether each memory cell programmed to the reset state has been successfully programmed twice in succession (S84). After step S84, selected memory cells that have been programmed to the reset state, but have been successfully programmed only once in succession are treated similar to failed cells and re-programmed by performing a step S85 (S84="NO"). However, if step S84 determines that all of the selected memory cells that have been programmed to the reset state have been successfully programmed twice in succession (S84="YES"), the method terminates.

Where the method generates the "program fail" indication (S82="Fail"), the method then determines whether any failed cells among the selected memory cells were to be programmed to the reset state (S86). After step S86, any failed cells among the selected memory cells to be programmed to the reset state are re-programmed (S85). In addition, selected memory cells to be treated as failed cells following step S84 are also re-programmed in step S85. However, after step S86, if all failed cells are to be programmed to the set state, all selected memory cells to be programmed to the set state are re-programmed (S88).

Each time either of steps S85 and S88 is performed, steps S81 and S82 are repeated. Then, after step S82 is performed, additional steps among steps S83, S84, S86, S85, and S88 may be taken depending on whether the method generates the "program fail" or "program pass" indication.

By performing different operations on selected memory cells to be programmed to the reset state and the set state, respectively, the method illustrated in FIG. 8 prevents selected memory cells from being programmed to the "over reset" region. In addition, by requiring that selected memory cells to be programmed to the reset state must be successfully programmed twice in succession, the method of FIG. 8 prevents a large number of memory cells in the reset state from having resistances undesirably close to a verify resistance level.

Figure 9:
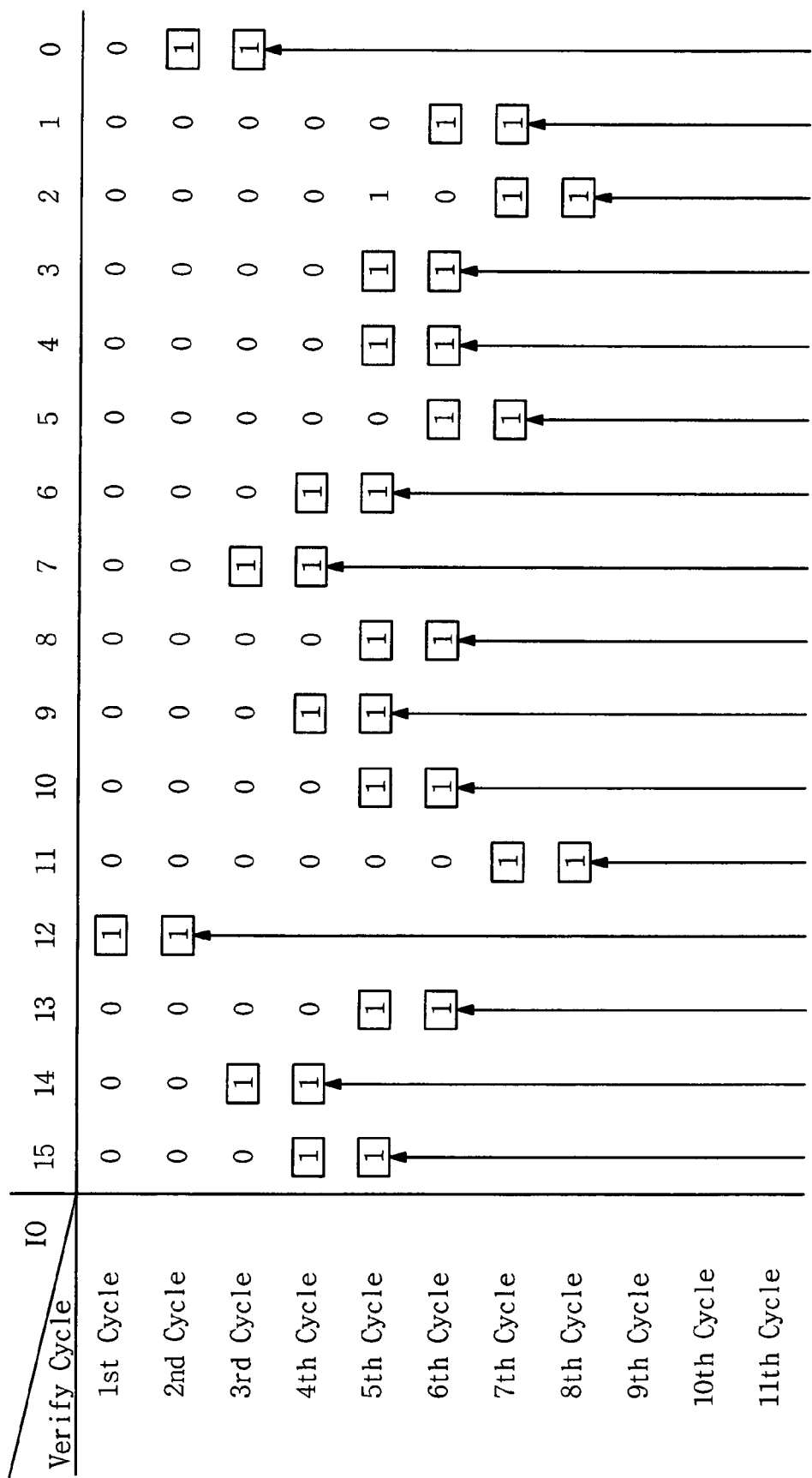
FIG. 9 is a chart illustrating an example of a program operation performed using the method of FIG. 8.

FIG. 9 is a chart illustrating an example of a program operation performed using the method of FIG. 8. For explanation purposes, it will be assumed that the method is used to program 16 selected memory cells and that each of the selected memory cells is to be programmed to the reset state (represented by the label "1" in FIG. 9). Initially, each of the selected memory cells is assumed to be in the set state (represented by the label "0" in FIG. 9). In FIG. 9, the 16 selected memory cells are represented by the labels 0 through 15 across a top part of the chart. Iterations of the verification read operation of step S81 ("verify cycles") are represented as first through eleventh cycles on a left side part of the chart.

Referring to FIG. 9, after a first verify cycle, only a selected memory cell 12 is successfully programmed to the reset state. After a second verify cycle, selected memory cell 12 is successfully programmed to the reset state for a second successive cycle, and therefore programming of selected memory cell 12 is completed. Programming of remaining selected memory cells is completed thereafter as indicated by boxes touching corresponding arrows. A selected memory cell 2 is initially successfully programmed to the reset state after a fifth verify cycle, but is unsuccessfully programmed to the reset state after a sixth verify cycle. Accordingly, programming of selected memory cell 2 does not complete until after an eighth verify cycle. Programming of all of the selected memory cells in FIG. 9 is completed after the eighth verify cycle.

Figure 10:
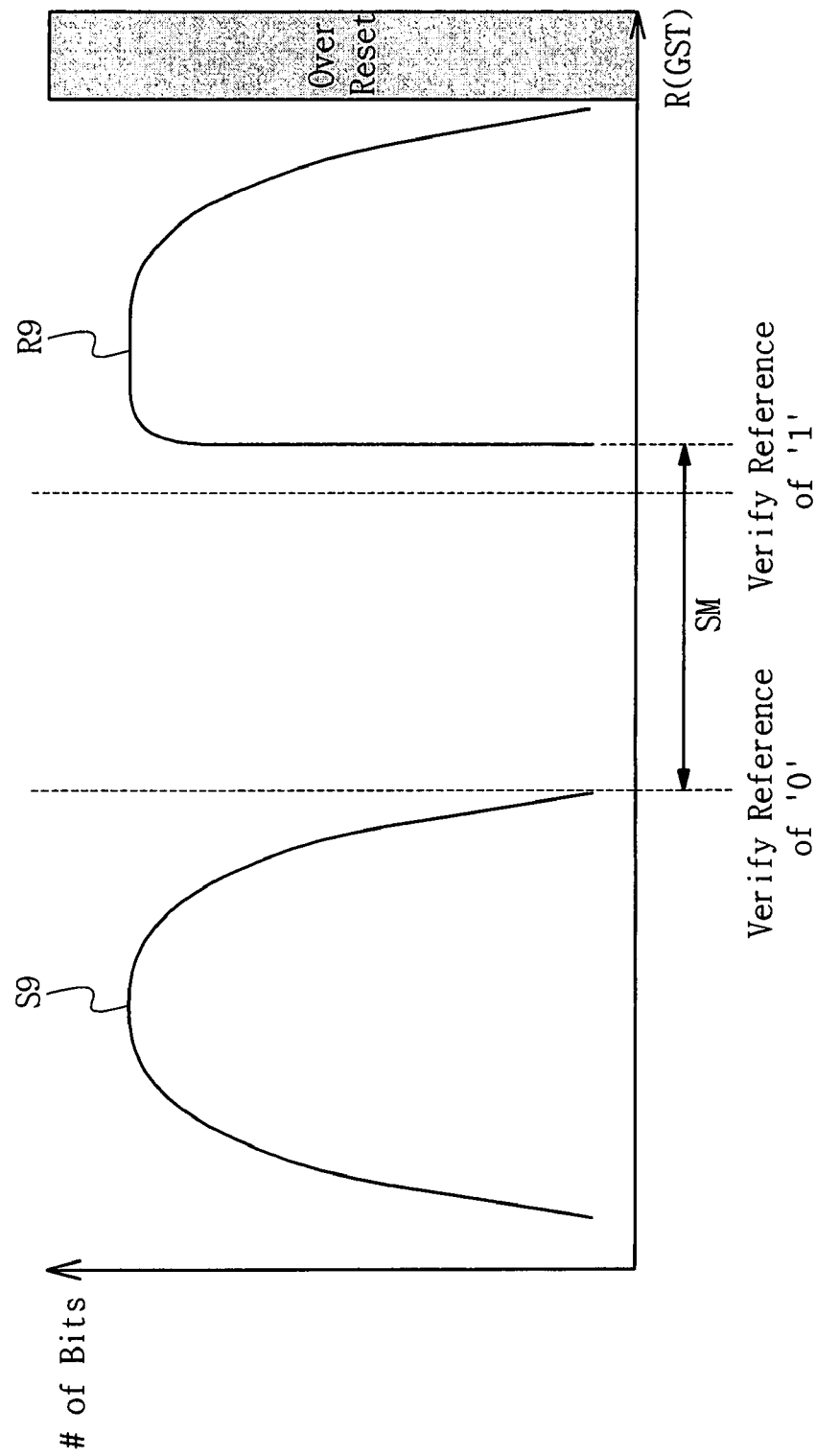
FIG. 10 is a graph illustrating resistance distributions for phase change memory cells in the "set state" and the "reset state" after the phase change memory cells have been programmed using the method illustrated in FIG. 8.

FIG. 10 is a graph illustrating resistance distributions for phase change memory cells in the "set state" and the "reset state" after the phase change memory cells have been programmed using the method illustrated in FIG. 8. In FIG. 10, resistance "R" of the GST compound in the phase change memory cells is measured along the x-axis, and a number of phase change memory cells in a phase change memory device having each particular resistance value is measured along the y-axis.

In FIG. 10, a first distribution labeled "S9" represents phase change memory cells in the "set state" and a second distribution labeled "R9" represents phase change memory cells in the "reset state". A sensing margin "SM" exists in FIG. 10 between a maximum value of the first distribution and a minimum value of the second distribution. The sensing margin "SM" of FIG. 10 is substantially the same as the sensing margin "SM" of FIG. 7. However, the second distribution in FIG. 10 is translated to the right relative to the second distribution in FIG. 7 and therefore the second distribution in FIG. 10 is further away from a boundary of the sensing margin than the second distribution in FIG. 7.

In FIG. 10, a pair of relatively long dotted lines represent verify resistance levels used to determine the respective logic states of data stored in the phase change memory cells of the phase change memory device. In particular, a dotted line labeled "verify reference of '0'" denotes a first verify resistance level used to determine whether a phase change memory cell stores a logical "0". Similarly, a dotted line labeled "verify reference of '1'" denotes a second verify resistance level used to determine whether a phase change memory cell stores a logical "1".

Where the phase change material in a particular phase change memory cell of the phase change memory device has a resistance less than the first verify resistance level, the particular phase change memory cell stores a logical "0". On the other hand, where the phase change material in the particular phase change memory cell of the phase change memory device has a resistance greater than the second verify resistance level, the particular phase change memory cell stores a logical "1". Finally, where the phase change material in the particular phase change memory cell of the phase change memory device has a resistance between the first and second verify resistance levels, the particular phase change memory cell does not store any data.

Because the second distribution in FIG. 10 is shifted to the right relative to the second distribution in FIG. 7, it is less likely that selected memory cells programmed to the reset state using the method of FIG. 8 will exhibit read errors due to slight variations in read conditions such as variation in a reference read resistance or slight perturbations in the measured resistance values of the selected memory cells.

Figure 11:
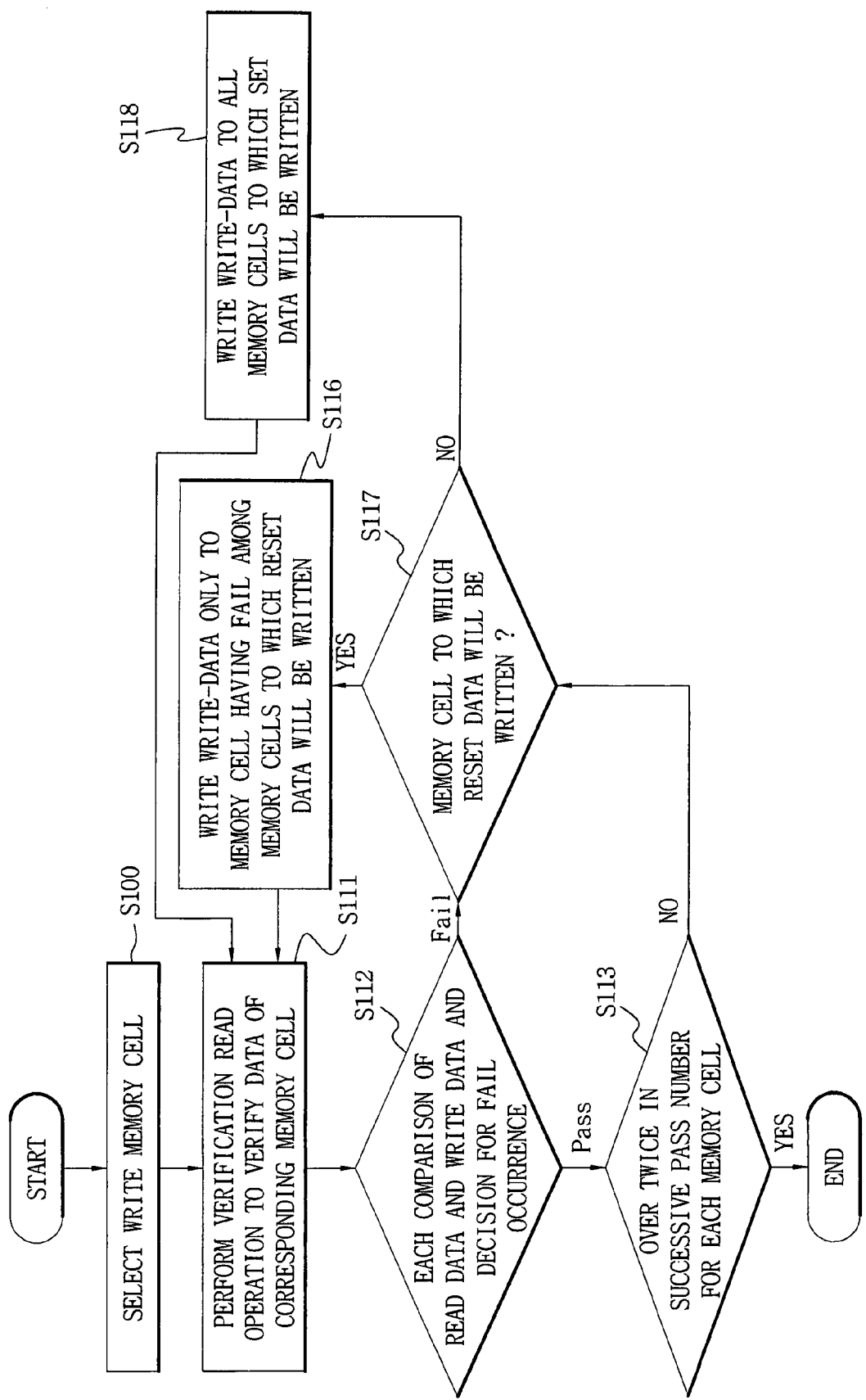
FIG. 11 is a flowchart illustrating a method of performing a program operation in a phase change memory device according to still another embodiment of the invention.

FIG. 11 is a flowchart illustrating a method of performing a program operation in a phase change memory device according to still another embodiment of the invention.

Referring to FIG. 11, the method first selects a plurality of phase change memory cells in the phase change memory device (S100). After step S100, the method performs a verification read operation to detect whether each of the selected memory cells has a desired logic state (S111). Based on the comparisons performed in the verification read operation, the method determines whether the read data for any of the selected memory cells is different from corresponding program data (S112). Where one or more comparisons between read data and program data in the verification read operation indicates that the read data for a particular one of the selected memory cells is different from the program data for the particular one of the selected memory cells, the method generates a program fail indication. Otherwise, the method generates a program pass indication.

Where the method generates the program pass indication (S112="Pass"), the method then determines whether each of the selected memory cells has been successfully programmed twice in succession (S113). In contrast to the method of FIG. 8, the method of FIG. 11 requires that selected memory cells to be programmed to both the "set state" and the "reset state" must be successfully programmed twice in succession. In addition, in the method of FIG. 11, all selected memory cells are repeatedly re-programmed until all of the selected memory cells have been successfully programmed twice in succession.

Where step S113 determines that all of the selected memory cells have been successfully programmed twice in succession (S113="YES"), the method terminates. Otherwise (S113="NO"), where step S113 determines that not all of the selected memory cells have been successfully programmed twice in succession, the method then performs a step S117.

In step S117, the method determines whether each of the selected memory cells that has not been successfully programmed twice in succession is to be programmed to the reset state or to the set state (S117). Where any of the selected memory cells that has not been successfully programmed twice in succession is to be programmed to the reset state, the method re-programs all of the selected memory cells to be programmed to the reset state (S116). Similarly, where any of the selected memory cells that has not been successfully programmed twice in succession is to be programmed to the set state, the method re-programs all of the selected memory cells to be programmed to the set state (S118).

Where the method generates the program fail indication (S112="Fail"), step S117 is performed for all of the selected memory cells, followed by steps S116 and/or S118 as described above.

Each time either of steps S116 and S118 is performed, steps S111 and S112 are repeated. Then, after step S112 is performed, additional steps among steps S113, S116, S117, and S118 may be taken depending on whether the method generates the "program fail" or "program pass" indication.

By performing different operations on selected memory cells to be programmed to the reset state and the set state, respectively, the method illustrated in FIG. 11 prevents selected memory cells from being programmed to the "over reset" region. In addition, by requiring all of the selected memory cells to be successfully programmed twice in succession, the method of FIG. 11 reduces a likelihood of read failures by creating additional distance between resistance levels of the selected memory cells in the set and reset states and corresponding verify resistance levels.

FIG. 12 is a chart illustrating an example of a program operation performed using the method of FIG. 11. For explanation purposes, it will be assumed that the method is used to program 16 selected memory cells and that each of the selected memory cells is to be programmed to the reset state (represented by the label "1" in FIG. 12). Initially, each of the selected memory cells is assumed to be in the set state (represented by the label "0" in FIG. 12). In FIG. 12, the 16 selected memory cells are represented by the labels 0 through 15 across a top part of the chart. Iterations of the verification read operation of step S111 ("verify cycles") are represented as first through eleventh cycles on a left side part of the chart.

Referring to FIG. 12, after a first verify cycle, only a selected memory cell 12 is successfully programmed to the reset state. After a second verify cycle, selected memory cell 12 is successfully programmed to the reset state for a second successive cycle. However, selected memory cell 12 is re-programmed several additional times until each of the 16 selected memory cells has been successfully programmed twice in succession. Programming of all of the selected memory cells in FIG. 12 is completed after the eighth verify cycle when all of the selected memory cells have been successfully programmed at least twice in succession.

Figure 13:
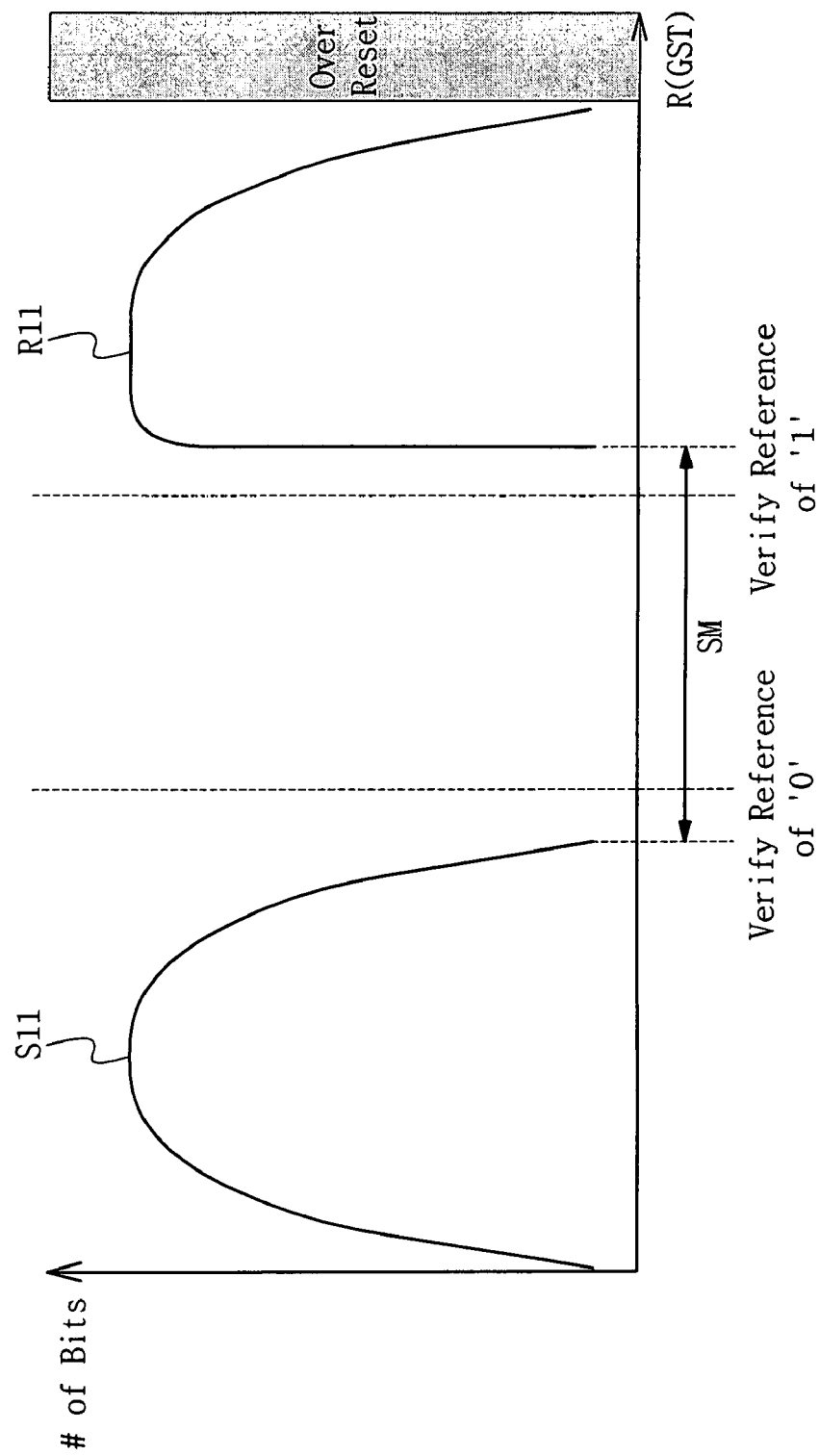
FIG. 13 is a graph illustrating resistance distributions for phase change memory cells in the "set state" and the "reset state" after the phase change memory cells have been programmed using the method illustrated in FIG. 11.

FIG. 13 is a graph illustrating resistance distributions for phase change memory cells in the "set state" and the "reset state" after the phase change memory cells have been programmed using the method illustrated in FIG. 11. In FIG. 13, resistance "R" of the GST compound in the phase change memory cells is measured along the x-axis, and a number of phase change memory cells in a phase change memory device having each particular resistance value are measured along the y-axis.

In FIG. 13, a first distribution labeled "S11" represents phase change memory cells in the "set state" and a second distribution labeled "R11" represents phase change memory cells in the "reset state". A sensing margin "SM" exists in FIG. 13 between a maximum value of the first distribution and a minimum value of the second distribution. The sensing margin "SM" of FIG. 13 is substantially the same as the sensing margin "SM" of FIG. 7. However, the first distribution in FIG. 13 is translated to the left relative to the first distribution in FIG. 7 and the second distribution in FIG. 13 is translated to the right relative to the second distribution in FIG. 7. Accordingly, the first and second distributions in FIG. 10 are further away from respective boundaries of the sensing margin than the first and second distributions in FIG. 7.

In FIG. 13, a pair of relatively long dotted lines represent verify resistance levels used to determine the respective logic states of data stored in the phase change memory cells of the phase change memory device. In particular, a dotted line labeled "verify reference of '0'" denotes a first verify resistance level used to determine whether a phase change memory cell stores a logical "0". Similarly, a dotted line labeled "verify reference of '1'" denotes a second verify resistance level used to determine whether a phase change memory cell stores a logical "1".

Where the phase change material in a particular phase change memory cell of the phase change memory device has a resistance less than the first verify resistance level, the particular phase change memory cell stores a logical "0". On the other hand, where the phase change material in the particular phase change memory cell of the phase change memory device has a resistance greater than the second verify resistance level, the particular phase change memory cell stores a logical "1". Finally, where the phase change material in the particular phase change memory cell of the phase change memory device has a resistance between the first and second verify resistance levels, the particular phase change memory cell does not store any data.

Because the first and second distributions in FIG. 13 are shifted relative to the first and second distributions in FIG. 7, it is less likely that selected memory cells programmed to the set or reset states using the method of FIG. 11 will exhibit read errors due to slight variations in read conditions such as variation in a reference read resistance or slight perturbations in the measured resistance values of the selected memory cells.

In the above described exemplary embodiments, various methods are provided for increasing the reliability of phase change memory devices. For example, exemplary methods of performing program operations in the phase change devices prevent the occurrence of read and programming errors.

As described above, various embodiments of the invention provide methods for obtaining desired read sensing margins for semiconductor memory devices. In addition, selected embodiments of the invention prevent programming of selected memory cells to an over reset region. Moreover, some embodiments of the invention prevent programming errors by requiring each selected memory cell to be successfully programmed twice in succession. Further, in some embodiments, some selected memory cells are re-programmed to the reset state fewer times than other selected memory cells are programmed to the set state, conserving programming time and power consumption.

The foregoing exemplary embodiments are teaching examples. Those of ordinary skill in the art will understand that various changes in form and details may be made to the exemplary embodiments without departing from the scope of the invention as defined by the following claims.

What is claimed:

1. A method of performing a program operation in a phase change memory device comprising a plurality of phase change memory cells, the method comprising:
   (a) selecting multiple memory cells among the plurality of phase change memory cells;
   (b) programming a bit of program data to each of the selected memory cells, wherein each bit of program data comprises a bit of set data or a bit of reset data;
   (c) performing a verification read operation on the selected memory cells, the verification read operation comprising comparing a bit of read data stored in each of the selected memory cells with a corresponding bit among the program data;
   (d) identifying any failed cells, for which the read data is detected to be different from the corresponding program data, among the selected memory cells by determining whether each bit of read data stored in the selected memory cells is the same as the corresponding bit among the program data;
   (e) upon identifying at least one failed cell among the selected memory cells, determining whether a corresponding bit of program data for any of the failed cells comprises a bit of set data, and determining whether a corresponding bit of program data for any of the failed cells comprises a bit of reset data;
   (f) upon determining that a corresponding bit of program data for any of the failed cells comprises a bit of set data, re-programming all of the selected memory cells for which the corresponding bit of program data comprises a bit of set data; and
   (g) upon determining that a corresponding bit of program data for any of the failed cells comprises a bit of reset data, re-programming each of the failed cells for which the corresponding bit of program data comprises a bit of reset data, and not re-programming selected memory cells that have been successfully programmed with a bit of reset data.

2. The method of claim 1, further comprising:
   (h) upon determining, in the verification read operation, that each bit of read data stored in the selected memory cells is identical to a corresponding bit among the program data, terminating the program operation.

3. The method of claim 2, further comprising:
   repeating (c), (d), (e), and (f) until each bit of read data stored in the selected memory cells is the same as a corresponding bit among the program data.

4. The method of claim 1, further comprising:
   (h) upon determining, in the verification read operation, that each bit of read data stored in the selected memory cells is the same as a corresponding bit among the program data, determining whether each of the selected memory cells for which the corresponding bit of program data comprises a bit of reset data has been successfully programmed twice in succession; and
   (i) upon determining that at least one of the selected memory cells for which the corresponding bit of program data comprises a bit of reset data has not been successfully programmed twice in succession, repeating (b), (c), (d), (e), (f), and (g) until each of the selected memory cells for which the corresponding bit of program data comprises a bit of reset data has been successfully programmed twice in succession.

5. The method of claim 1, further comprising:
   (h) upon determining, in the verification read operation, that each bit of read data stored in the selected memory cells is the same as a corresponding bit among the program data, determining whether each of the selected memory cells has been successfully programmed twice in succession; and
   (i) upon determining that at least one of the selected memory cells has not been successfully programmed twice in succession, repeating (b), (c), (d), (e), (f), and (g) until each of the selected memory cells has been successfully programmed twice in succession.

6. The method of claim 1, wherein each of the plurality of phase change memory cells comprises a phase change material and a diode.

7. The method of claim 1, wherein programming the bit of program data to each of the selected memory cells comprises:
   applying respective program currents or program voltages to the selected memory cells to heat respective phase change materials within the selected memory cells.

8. A method of performing a program operation in a phase change memory device comprising a plurality of phase change memory cells, the method comprising:

(a) selecting multiple memory cells among the plurality of phase change memory cells;
(b) programming a bit of program data to each of the selected memory cells, wherein each bit of program data comprises a bit of set data or a bit of reset data;
(c) performing a verification read operation on the selected memory cells, the verification read operation comprising comparing a bit of read data stored in each of the selected memory cells with a corresponding bit among the program data;
(d) identifying any failed cells, for which the read data is detected to be different from the corresponding program data, among the selected memory cells by determining whether each bit of read data stored in the selected memory cells is the same as the corresponding bit among the program data; and
(e) upon identifying at least one failed cell among the selected memory cells, re-programming all of the selected memory cells.

9. The method of claim 8, further comprising:
(f) upon determining, in the verification read operation, that each bit of read data stored in the selected memory cells is identical to a corresponding bit among the program data, terminating the program operation.

10. The method of claim 8, further comprising:
repeating (c), (d), and (e) until each of the selected memory cells has been successfully programmed.

11. The method of claim 8, further comprising:
upon identifying at least one failed cell among the selected memory cells, generating a fail indication; and
re-programming all of the selected memory cells in response to the fail indication.

12. The method of claim 8, wherein each of the plurality of phase change memory cells comprises a phase change material and a diode.

13. The method of claim 8, wherein programming the bit of program data to each of the selected memory cells comprises:
applying respective program currents or program voltages to the selected memory cells to heat respective phase change materials within the selected memory cells.

14. A method of performing a program operation in a phase change memory device comprising a plurality of phase change memory cells, the method comprising:
(a) selecting multiple memory cells among the plurality of phase change memory cells;
(b) programming a bit of program data to each of the selected memory cells, wherein each bit of program data comprises a bit of set data or a bit of reset data;
(c) performing a verification read operation on the selected memory cells, the verification read operation comprising comparing a bit of read data stored in each of the selected memory cells with a corresponding bit among the program data;
(d) identifying any failed cells, for which the read data is detected to be different from the corresponding program data, among the selected memory cells by determining whether each bit of read data stored in the selected memory cells is the same as the corresponding bit among the program data; and
(e) upon identifying at least one failed cell among the selected memory cells, re-programming all failed cells among the selected memory cells.

15. The method of claim 14, further comprising:
(f) upon determining, in the verification read operation, that each bit of read data stored in the selected memory cells is identical to a corresponding bit among the program data, terminating the program operation.

16. The method of claim 14, further comprising:
repeating (c), (d), and (e) until each of the selected memory cells has been successfully programmed.

17. The method of claim 14, further comprising:
upon identifying at least one failed cell among the selected memory cells, generating a fail indication; and
re-programming all failed cells among the selected memory cells in response to the fail indication.

18. The method of claim 14, wherein each of the plurality of phase change memory cells comprises a phase change material and a diode.

19. The method of claim 14, wherein each of the plurality of phase change memory cells comprises a phase change material and an access transistor.

20. The method of claim 14, wherein programming the bit of program data to each of the selected memory cells comprises:
applying respective program currents or program voltages to the selected memory cells to heat respective phase change materials within the selected memory cells.

* * * * *